United States Patent [19]

Cray, Jr.

[11] Patent Number: 4,590,538
[45] Date of Patent: May 20, 1986

[54] IMMERSION COOLED HIGH DENSITY ELECTRONIC ASSEMBLY

[75] Inventor: Seymour R. Cray, Jr., Chippewa Falls, Wis.

[73] Assignee: Cray Research, Inc., Chippewa Falls, Wis.

[21] Appl. No.: 442,569

[22] Filed: Nov. 18, 1982

[51] Int. Cl.⁴ .............................................. H05K 7/20
[52] U.S. Cl. ...................................... 361/385; 361/382
[58] Field of Search ............... 361/382, 383, 384, 385, 361/386, 412; 165/104.33; 174/15 R; 62/415, 416, 417, 418

[56] References Cited

U.S. PATENT DOCUMENTS

| | | |
|---|---|---|
| 1,641,702 | 9/1927 | Sprong . |
| 1,950,653 | 3/1934 | Best . |
| 2,643,282 | 6/1953 | Greene . |
| 2,879,455 | 3/1959 | Scal . |
| 2,917,685 | 12/1959 | Wiegand . |
| 2,948,518 | 8/1960 | Kraus . |
| 3,065,384 | 11/1962 | Sprude . |
| 3,070,729 | 12/1962 | Heidler ............................... 361/382 |
| 3,139,559 | 6/1964 | Heidler . |
| 3,141,999 | 7/1964 | Schneider ........................... 361/382 |
| 3,270,250 | 8/1966 | Davis ............................... 165/104.33 |
| 3,334,684 | 8/1967 | Roush et al. |
| 3,370,203 | 2/1968 | Kravitz et al. |
| 3,417,814 | 12/1968 | Oktay . |
| 3,459,998 | 8/1969 | Focarile . |
| 3,504,268 | 3/1970 | Hoffman et al. ..................... 361/382 |
| 3,512,582 | 5/1970 | Chu et al. |
| 3,527,989 | 9/1970 | Cuzner et al. |
| 3,529,213 | 9/1970 | Farrand et al. |
| 3,537,063 | 10/1970 | Beaulieu . |
| 3,586,959 | 6/1971 | Eccles ................................ 361/385 |
| 3,630,273 | 12/1971 | Haye et al. ......................... 165/122 |
| 3,741,292 | 6/1973 | Aakalu et al. |
| 3,812,402 | 5/1974 | Garth ................................. 361/385 |
| 3,833,840 | 9/1974 | Sinden . |
| 3,851,221 | 11/1974 | Beaulieu et al. |
| 3,904,934 | 9/1975 | Martin . |
| 3,999,105 | 12/1976 | Archey et al. |
| 4,072,188 | 2/1978 | Wilson et al. ..................... 361/385 |
| 4,120,021 | 10/1978 | Roush . |
| 4,283,754 | 8/1981 | Parks . |
| 4,302,793 | 11/1981 | Rohner . |
| 4,417,297 | 11/1983 | Oyama et al. ...................... 361/412 |
| 4,420,739 | 12/1983 | Herren . |

FOREIGN PATENT DOCUMENTS

| | | | |
|---|---|---|---|
| 0608258 | 9/1956 | Canada ................................. 361/412 |
| 0839083 | 6/1981 | U.S.S.R. .............................. 361/386 |

OTHER PUBLICATIONS

*IBM Technical Disclosure Bulletin*, vol. 20, No. 9, Feb. 1978, "Liquid Jet Cooling of Integrated Circuit Chips", Sachar, pp. 3727–3728.

*IBM Technical Disclosure Bulletin*, vol. 10, No. 10, Mar. 1968, "Thermal Card and Deflector System for Augmenting Emersion Cooling", Chu et al., pp. 1559–1560.

*IBM Technical Disclosure Bulletin*, vol. 8, No. 10, Mar. 1966, "Heat Dissipator Assemblies", Mandel et al., p. 1460.

Primary Examiner—Gregory D. Thompson
Attorney, Agent, or Firm—Merchant, Gould, Smith, Edell, Welter & Schmidt

[57] ABSTRACT

An immersion cooling system for high density electronic assemblies such as computers includes a container holding an inert cooling liquid, and stacks of circuit modules arranged in a generally radial pattern within the container. Coolant supply columns and coolant removal columns alternate between adjacent stacks around the pattern. The coolant supply columns include distribution manifolds which distribute incoming coolant at all levels to provide a flow of coolant to all circuit modules. The flow passes between adjacent boards of the modules and preferably along flow channels formed by the circuit chips aligned in rows. After passing across the circuit modules the heated coolant rises in coolant removal columns and flows over standpipes for removal from the container, and a pump and heat exchanger recools and recirculates the coolant. Pump up and pump down systems are also provided for withdrawing the coolant to a reservoir for servicing the circuitry.

17 Claims, 16 Drawing Figures

IMMERSION COOLED HIGH DENSITY ELECTRONIC ASSEMBLY

BACKGROUND OF THE INVENTION

This invention pertains generally to the field of electronic assemblies and cooling systems therefor. While applicable to a variety of electronic fields, it is believed that this invention has its greatest applicability in the field of high speed, high capacity digital computers, sometimes referred to as supercomputers, and the description herein of the presently preferred embodiment of the invention illustrates the use of the invention in such a computer.

In the development of very high speed computers, great efforts have been directed toward reducing the physical dimensions of the computer assembly because signal propagation delays due to the maximum interconnect path length limit the maximum clock rate and hence speed of operation of the computer. Currently available generations of logic and memory integrated circuits are capable of switching at clock rates in the nanosecond range, but in order for such a rate to be used in the computer, the maximum length of the longest interconnecting path between circuits must be held to a very short distance, for example, about 16 inches length in the case of twisted wire pairs for four nanosecond operation.

Advances in integrated circuit technology have produced devices with increased numbers of logic gates and memory circuits per chip, making it theoretically possible to assemble the great number of logic and memory circuits needed for a supercomputer within an area permitting a 16-inch or comparably short wire length interconnect distance. Unfortunately, that theoretically possible high density cannot be achieved in practice unless the very considerable amount of heat generated by such a high density assemblage of circuits can be successfully removed. A single emitter coupled logic integrated circuit can dissipate as heat energy up to one watt of power. With high density packaging it is possible to put enough of such integrated circuits into a 1-inch by 4-inch by 8-inch module to generate 600 or 700 watts. When it is considered that many dozens of such modules would have to be placed close together to achieve the desired result, it can be appreciated that the amount of heat to be dissipated far exceeds available cooling techniques.

A number of techniques have been developed in the field of electronics for cooling electronic components and circuits. When air cooling and forced air cooling became inadequate, liquid or refrigerant filled cold bar or cold plate chassis members were developed for supporting circuit modules and conducting heat away from them. In U.S. Pat. No. 4,120,021 which is assigned to the assignee of this application, a cooling system is disclosed employing refrigerant cooled cold bars having slots and clamping means for receiving the edges of plates to which circuit boards are mounted. Heat generated by the circuit components is transmitted by convection and conduction to the cold plates and then to the cold bars. While this technique has been extremely successful for its intended purpose, it is insufficient for the extremely high density and heat loading described above.

Cooling of electronic components by immersion in inert liquid has been practiced in various forms in a number of areas of electronics. Inert liquids suitable for electronic immersion are available, for example, a fluorocarbon product called Fluorinert produced by the 3M Company. These liquids can be obtained with different boiling points to serve different needs. A common use has been the placing of a single component in such fluid for isolating it for testing purposes. High-powered rectifiers have also been immersion cooled. Computer circuit modules have been proposed in which a number of circuit boards have been mounted within a sealed container to form a module of a computer system. The modules are filled with inert liquid which removes heat from the circuits by nucleate boiling and recondensing on the walls of the module. The heat is then transferred to the surrounding air by fins formed on the housing of the module.

Immersion cooling has great advantages over air cooling in terms of higher heat transfer rate and higher heat capacity of liquid compared with gas. However, immersion of circuitry in fluid alone is not sufficient to solve the heat problems associated with the very high density, large scale systems discussed above. It is necessary to also provide for mechanical and electrical construction of the electronic assembly in a manner that permits very high density packaging and effective removal of heat from the components by the liquid, while still providing an assembly reasonably accessible for service or updates.

SUMMARY OF INVENTION

The present invention provides an improved immersion cooled high density electronic assembly which permits extremely high speed operation of a high capacity computer with large immediately available random access memory, all within an extremely compact volume, coupled with a liquid immersion and circulation system to successfully handle the very high heat load produced.

According to one aspect of the invention, circuit elements are provided in stacks of circuit boards, with means supporting the boards and arranging the stacks adjacent one another but spaced apart to form coolant flow columns therebetween, the entire structure being within a container or tank for total immersion in a coolant liquid. Means are provided for supplying fluid into alternate ones of said coolant flow columns and out the others, to establish coolant flow between and across the circuit boards of the stacks.

In a preferred form, standpipes are placed in the alternate coolant flow columns for removal of coolant, after it passes through the stacks and rises upwardly along the standpipe then over the top.

According to a preferred form of the invention, capped standpipes serving as distribution manifolds are placed in the alternate coolant inlet columns, and have a plurality of holes distributed along their lengths, to provide equal distribution of coolant to all circuit boards of the stack.

According to another aspect of the invention, the circuit boards of the stacks are arranged in a plurality of modules, each module comprising a plurality of circuit boards containing electronic circuit components thereon, and secured together in spaced relationship by a plurality of spacer or jumper pins which also provide electrical connections between adjacent boards. Circuit components are preferably arranged in rows thereby forming channels for coolant flow across each board, between adjacent boards. The spacers are selected in length for high density packing while providing sufficient clearance for components and space for coolant flow. Connectors are provided at first ends of the boards for interconnection by wiring harnesses to other boards or modules, and power connections are provided at their other ends.

According to a preferred form of the invention, a number of stacks of said modules are provided, with support means therefor provided for positioning the stacks in a generally radial relationship with their connector ends adjacent one another and with sectorshaped coolant flow columns positioned therebetween to provide coolant circulation to the stacks. External means are provided for circulating the coolant through the columns and thereby across the circuit boards, and for cooling the coolant for recirculation.

DETAILED DESCRIPTION OF THE PREFERRED EMBODIMENT

Figure 2:
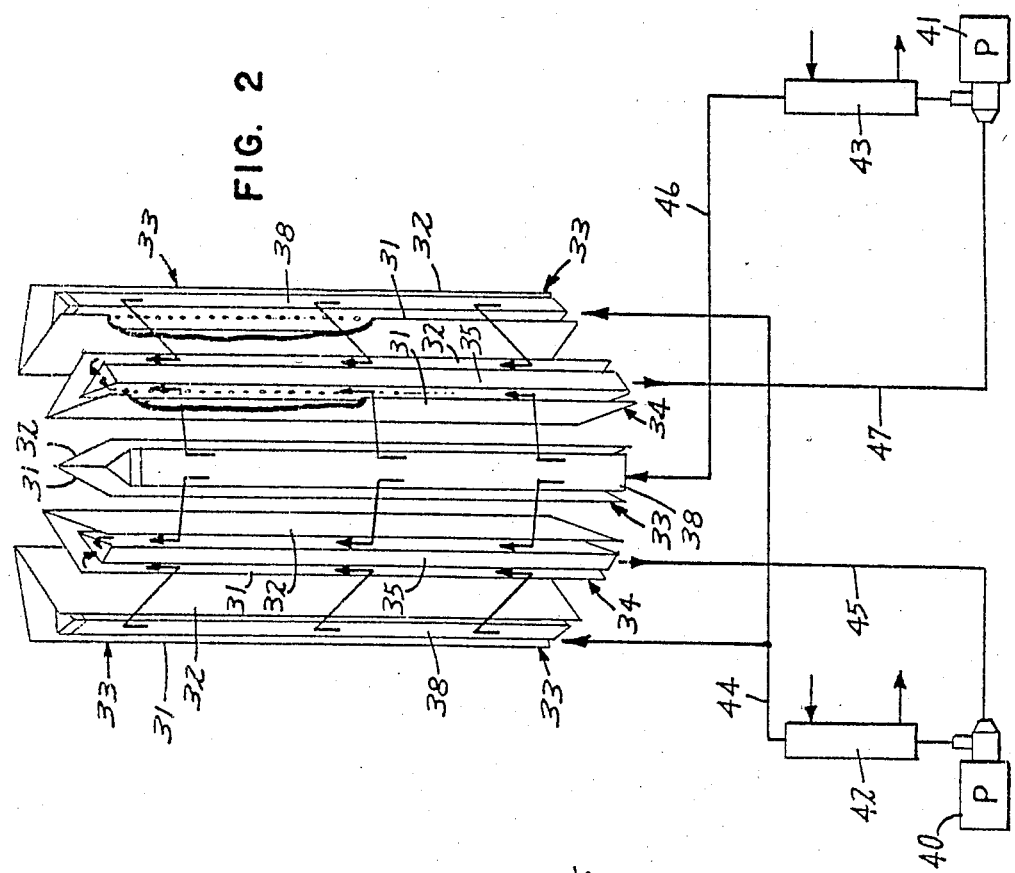
FIG. 2 is a schematic representation of the coolant circulation system and flow paths for a computer according to the present invention.

The immersion cooled high density electronic assembly of this invention is illustrated in the accompanying drawings and described herein in terms of a very high speed, large capacity digital computer. According to the invention, all electronic circuitry and wiring for the computer are mounted within a suitable tank or container, indicated by reference number 10 in FIG. 1, which holds the inert coolant liquid in which the computer circuitry is immersed. The tank or container can take any convenient form, and in the preferred embodiment, takes the form of a cylinder having a polygon cross section, being made up of a plurality of flat panels 15, supported by a framework of vertical and horizonal frame members 13 and 14, respectively. The frame members and panels are supported around a suitably shaped planar base member 11, and a cover 12 is also provided. For convenience in servicing the computer, the panels 15 are removable to provide access to the circuitry. Preferably they are also made of transparent material, which aids in filling and draining coolant and in service access in general.

Figure 1:
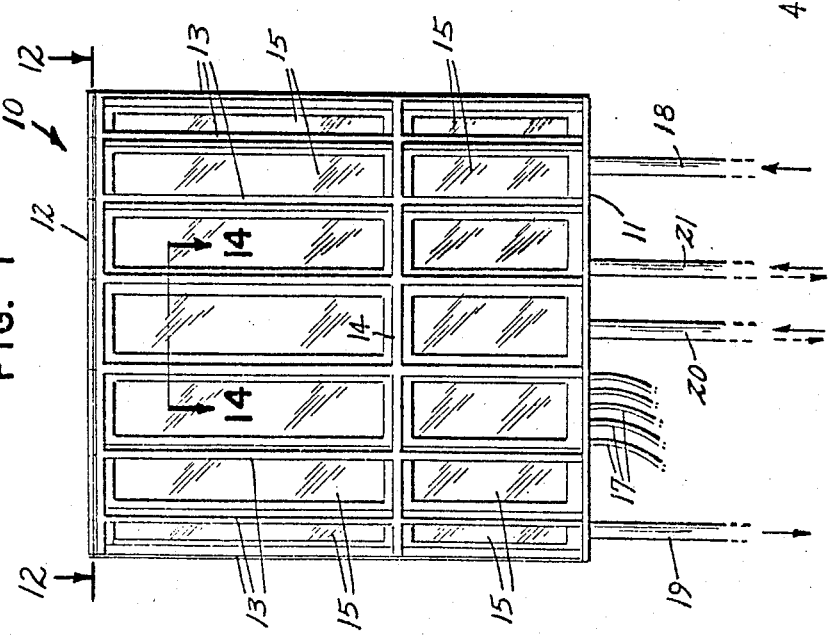
FIG. 1 is a side elevational view of a computer ng to the present invention showing the coolant fluid tank.

The base 11 has a number of apertures therein as explained more fully hereinafter to permit the passage of wiring and coolant flow paths to and from the interior of the tank. A coolant circulation inlet line 18, a coolant circulation outlet line 19, and a pair of coolant supply lines 20, 21 used for filling and draining coolant from the tank during pump up and pump down operations are schematically indicated in FIG. 1 as being representative of a number of such connections. Base 11 also has a plurality of holes through which wiring passes for bringing both AC power and data input/output lines to the computer, and several groups of such wiring are schematically represented by reference number 17 in FIG. 1. It will be understood that a number of such conduits can be provided, FIG. 1 being only schematic in nature.

Preferably the entire circuitry for the computer is placed within container 10 including one or more central processing units and all logic circuits associated therewith, and a large immediately accessible random access memory. Input/output processors and mass storage which are external of the computer and which operate at relatively slower rates communicate with the computer through input/output leads which pass through base 11 to the computer. In other words, all logic and memory needed for high speed operation are placed together in close proximity within the tank.

In addition, power supplies for the logic and memory are also provided within the tank, because the power supplies also produce a large amount of heat which must be removed, and also because of the desirability of having the power supplies in close physical proximity to the logic and memory circuits to reduce the length and the resistance of power and buses.

For convenience in servicing the computer, it is preferable that the power supplies be located lower in the tank or container 10 and the memory and logic circuits positioned higher. Preferably the horizontal frame members 14 are positioned at approximately the division line between the power and other circuits, which permit removal of an upper panel to gain access to a portion of the computer circuitry after draining the coolant level down to the level of the power supplies and horizontal frame member 14. This provides an efficiency in service because the logic and memory sections would probably need service or updates more often than the power supply section.

Figure 12:
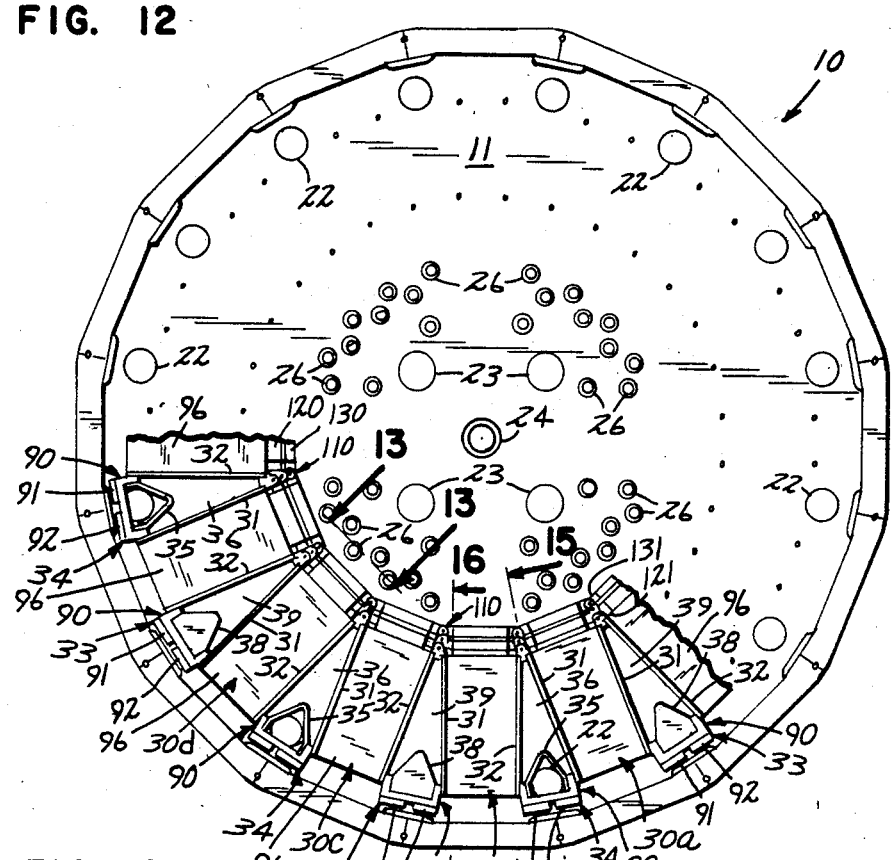
FIG. 12 is a horizontal sectional view as seen generally from the line 12—12 of FIG. 1.
Figure 13:
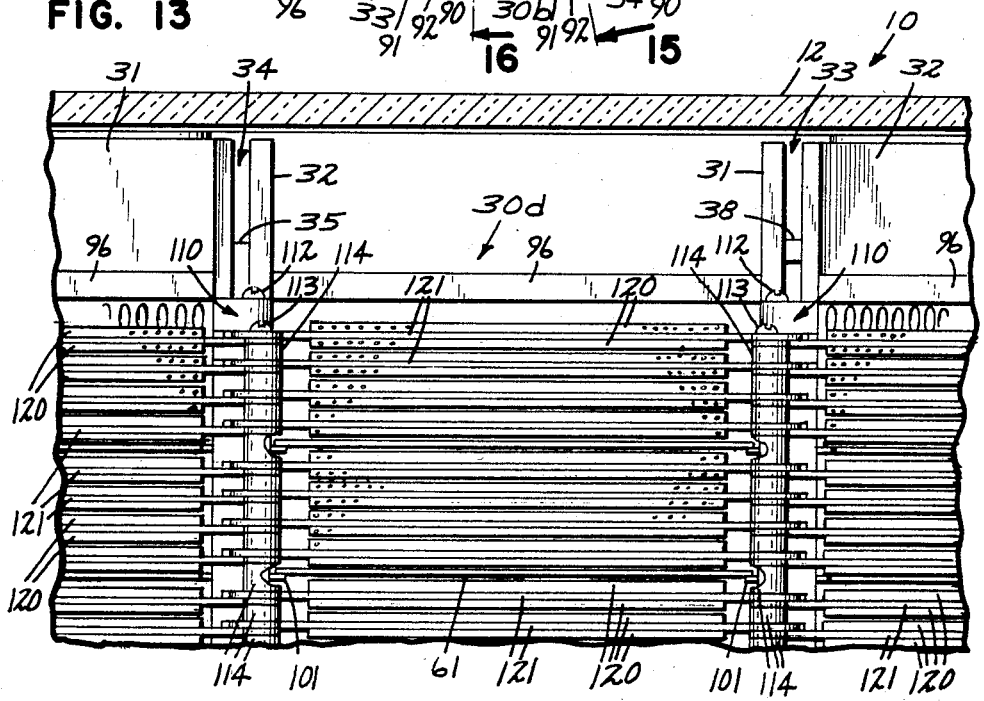
FIG. 13 is an enlarged sectional view seen generally along line 13—13 of FIG. 12.

Before proceeding to a detailed description of the construction of the preferred embodiment of the invention, a brief overview of the electronic assembly and the coolant circulation will be given with reference to FIG. 12 and FIG. 2. In FIG. 12, which is a top view of the tank of FIG. 1 with the cover removed, it will be seen that there are 16 stacks of circuit modules, three of which have been given reference numbers 30a, 30b, and 30c. The stacks consist of a number of modules each comprising a power supply or a plurality of horizontal circuit boards as explained subsequently. Each stack of modules is supported by a pair of vertical support frames 31, 32, which are adjacent the stack on either side. For purposes of clarity in FIG. 12, reference numbers are applied to components associated with only a few of the stacks to avoid clutter of the drawing, but it will be understood that the patterns of components associated with stacks 30a, b and c are repeated around the whole assembly for each of the stacks.

The module support frames 31 and 32 are vertically oriented planar shaped structures perforated with a large number of holes to permit the coolant to flow through them. Means are provided for supporting the stacks of modules on the adjacent supports. The supports are arranged in a pattern around the central zone of the computer to form a radial array of stacks of modules with their logic connector ends adjacent one another and facing inwardly to the central zone of the assembly. Between adjacent module stacks are formed sector or triangular shaped areas, indicated by reference numbers 33 and 34, which form vertical coolant flow columns. The inlet columns are indicated by reference number 33, and these alternate around the computer with outlet columns 34. The outlet columns 34 have standpipes 35 positioned therein. Standpipes 35 are also sector or triangular shaped, but are smaller than columns 34 to provide spaces 36 between standpipe 35 and the adjacent module supports 31, 32 to allow coolant to rising to the top to flow over the top of the standpipe and flow down the center thereof. Preferably, holes are also provided along the length of standpipes 35 for removal of coolant.

In the presently preferred embodiment of the invention, distribution manifolds in the form of capped standpipes 38 are used in inlet columns 33 to help even out the supply of fresh coolant to modules at all level in the stacks. Capped standpipes 38 are generally similar in configuration to outlet standpipes 35 except for a sealing cap at the top. They are placed over fluid inlet holes in the base, and they have a plurality of holes provided in their sides along the lengths thereof. These allow coolant to fill the distribution zones 39 within the inlet columns 33, to supply coolant to the adjacent stacks of modules.

Coolant circulation holes 22 are provided in base 11 within the sector-shaped areas for the vertical coolant columns. Appropriate connections are made by pipes beneath base 11 to connect these circulation holes 22 as coolant inlets for columns 33 and capped standpipes 38, or as coolant outlets for columns 34 and standpipes 35.

Depending upon the size of the computer involved, all 16 stacks may not be needed. The number of stacks needed depends upon the size of memory to be provided and whether the computer is a single processor or multiprocessor computer. For example, a four stack computer, an eight stack computer, or a 16 stack computer could be provided. If a computer of less than the full 16 stack complement were used, the tank or container 10 could of course be reshaped on the open or unused side to close around making a straight line approximation of an ellipse in cross section rather than continuing the full regular polygon shape. Also, it will be appreciated that by suitable changes to the angles, etc., a radial configuration having a greater or fewer number than 16 stacks could be provided as desired. However, opening the configuration up to include more than 16 stacks could increase the maximum interconnected path length within the central zone.

Referring now to FIG. 2, a schematic representation of a four stack computer, or of four stacks of a larger computer is given. Adjacent pairs of vertical module support frames 31, 32 are shown, converging at their inner ends to form the sector-shaped vertical coolant flow columns. Three supply columns 33 including capped standpipes 38 are indicated, alternating with a pair of return columns 34, each of which contains an outlet standpipe 35.

A pair of circulation pumps 40, 41 and corresponding heat exchangers 42, 43 are provided for circulating the liquid coolant through the computer immersed within the tank. Pump 40 circulates coolant through heat exchanger 42, where it is cooled by tap water or other cooling medium circulated through the heat exchanger. The cooled coolant flows through line 44, which branches to supply coolant to the left and right supply columns 33 of FIG. 2. Fluid from one of the standpipes 35 connects to return line 45 to pump 40. Similarly, fluid from the bottom of the other standpipe 35 connects through line 47 to pump 41, which sends it through heat exchanger 43 and line 46 to the other inlet column 33.

It will be appreciated that the power modules and also the logic and memory modules which are positioned in stacks between opposing module support frames as indicated in FIG. 12 have been omitted from FIG. 2 for purposes of illustrating the coolant flow. Coolant enters the tank in the vertical coolant flow columns 33, then travels horizontally through multiple paths, as suggested by the flow arrows, across and between all modules and all horizontal circuit boards that make up the modules. In flowing across and between the modules the coolant picks up the heat generated by their circuit components. Some of the coolant then flows through the holes in the outlet standpipes 35 and some of it flows vertically upward in zones 36 in columns 34 outside the standpipes, then flows over the tops of the stand-pipes 35 down through them for recirculation through the heat exchanger. The effect of inlet columns 33 is to provide fresh, equally cool coolant to all modules, both high and low in the stack. Some of the coolant may be heated to form small vapor bubbles and these also rise, but are sucked down and recondensed through standpipes 35.

Liquid-to-liquid type heat exchangers can be used for heat exchangers 42 and 43, and city water supply can be used for the cooling, providing that it remains reasonably cool, for example approximately 50 degrees Fahrenheit. Otherwise other types of heat exchangers or refrigeration cycle equipment can be used. Additional circulation pumps, heat exchangers and paths would be provided for the additional stacks and columns for a system larger than the four stack diagram of FIG. 2. Alternatively, larger capacity units could be used to circulate through the other stacks.

Figure 3:
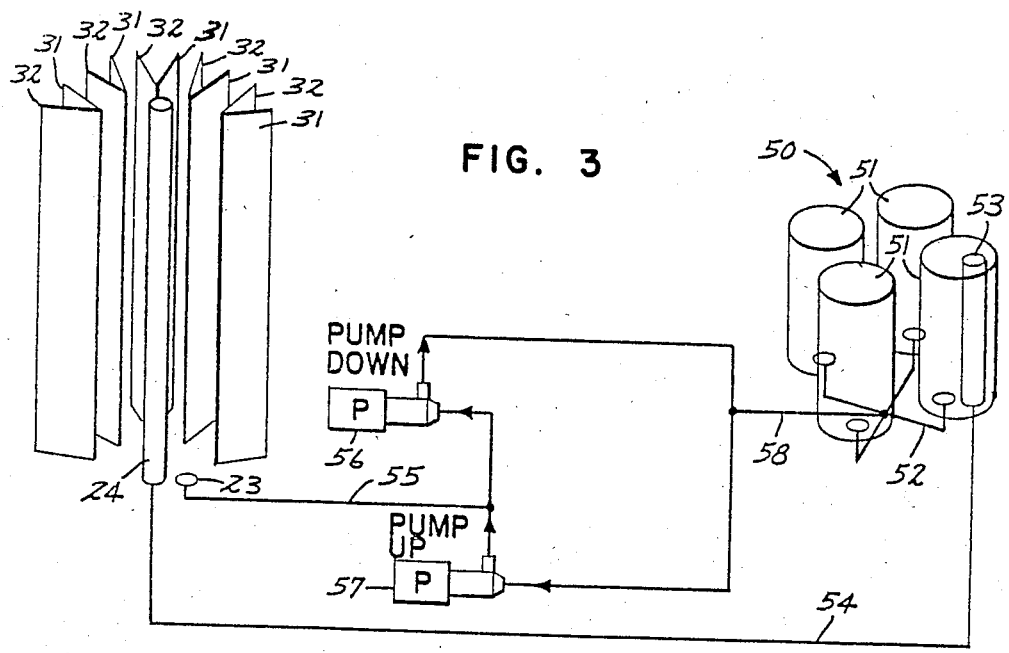
FIG. 3 is a schematic representation of the coolant pump up and pump down system for the computer.

FIG. 3 is a diagram similar to FIG. 2, but showing the coolant pump up/pump down system, rather than the coolant circulation system, which is shown in FIG. 2. In FIG. 3, the coolant pump up/pump down standpipe 24 is shown, together with one of the coolant supply/drain holes 23, of which four are shown in the base of the tank in FIG. 12. FIG. 3 also shows in schematic form pairs of module support frames 31 and 32 for four stacks of the computer. A reservoir 50 is provided, which for convenience may consist of a plurality of smaller reservoir tanks 51, interconnected by lines 52 through openings in their bases, to form a single reservoir. A standpipe 53 is provided in the reservoir with its open top near the top of the reservoir, but spaced below the cover. The bottom of standpipe 53 is not in communication with the reservoir but instead connects through a line 54 to standpipe 24 within the tank. Supply/drain hole 23 connects by a line 55, which branches to an inlet of pump down pump 56 and to an outlet of pump up pump 57. The connections at the bottom of reservoir 50, at line 52, connect to a line 58 which branches to the inlet to pump up pump 57 and the outlet of pump down pump 56.

During a pump up operation to initially fill the computer tank 10 with coolant previously stored in reservoir 50, pump 57 is activated and pump 56 is off. Pump 57 supplies coolant from the reservoir into supply/drain holes 23 to begin filling the reservoir. Air displaced from within the computer tank 10 escapes through standpipe 24 which equalizes pressure within reservoir 50 filling the volume as the coolant is lowered. Standpipe 24 also prevents overfilling of the tank. After the tank is filled, the circulation system of FIG. 2 is started and then electrical power can be provided to the computer circuitry. The pump up operation is generally maintained on at the same time that the circulation system is on, because the pump up circuit complements the circulation action. Standpipe 24 is slightly higher than the circulation standpipes 35, and it helps to pull down vapor that may be formed from the operation of the computer. As previously mentioned, as coolant circulates over the circuit elements, some vapor bubbles may be formed and these rise to the top of the container, so in typical operation there will be a small vapor pocket at the top. Standpipe 24 helps to pull down the vapor, where it is eventually recondensed with the other fluid.

For pumping down the system to gain access for service, after electrical power is removed from the computer the pump up and circulation systems are stopped, and the pump down pump 56 is started. It transfers coolant from supply/drain hole 23 into reservoir 50, and standpipes 24 and 53 and their interconnecting line 54 permit displacement of air or vapor to neutralize pressure as the liquid coolant is transferred.

Figure 4:
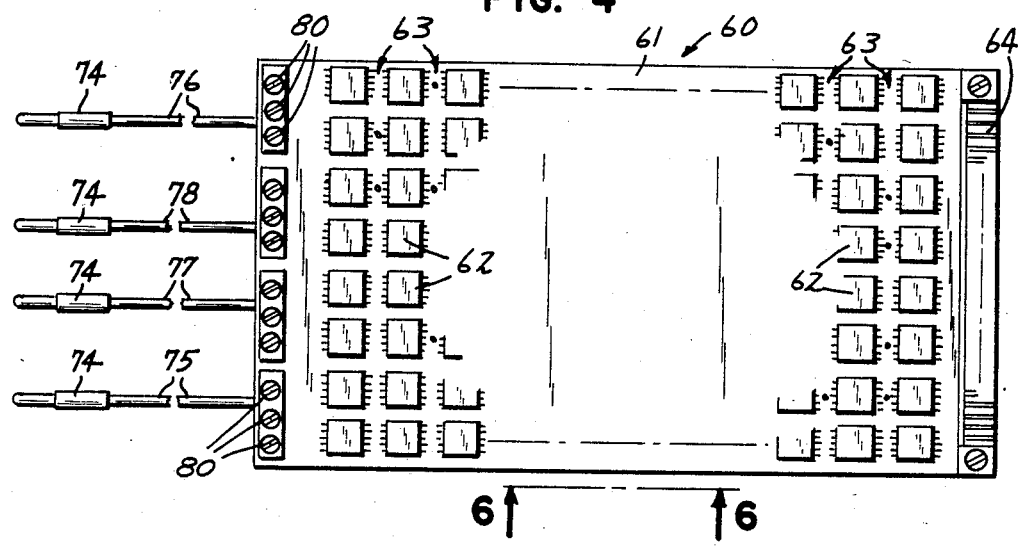
FIGS. 4 and 5 are top plan and side elevational views respectively of a circuit module for the computer assembly according to one aspect of the present invention.

According to one aspect of the invention, logic and memory circuits are constructed in modules as indicated in FIGS. 4–7. Each module consists of a sandwich of a number of individual circuit boards—eight boards being used per module in the preferred embodiment, although a greater or lesser number could be used. Reference number 60 generally indicates a logic or memory module. Its eight individual circuit boards 61 are positioned, by means discussed below, closely adjacent one another but spaced far enough to provide clearance of the integrated circuits 62 and other components which are mounted on the circuit boards. As seen in FIG. 4, the integrated circuits are arranged in rows on the boards to provide what amounts to channels 63 between adjacent rows of integrated circuits, to provide fluid flow paths.

The circuit boards 61 are constructed according to known techniques, and may preferably comprise multilayered construction with signal traces as required for connecting the various circuits for the particular memory or logic functional application for a particular part of the computer. Some of the signal traces lead to and connect with multiple pin connectors 64 along one end of each circuit board.

Interconnection of signal traces between adjacent circuit boards in a module is accomplished by jumper pins that also serve as mechanical spacers.

Figure 7:
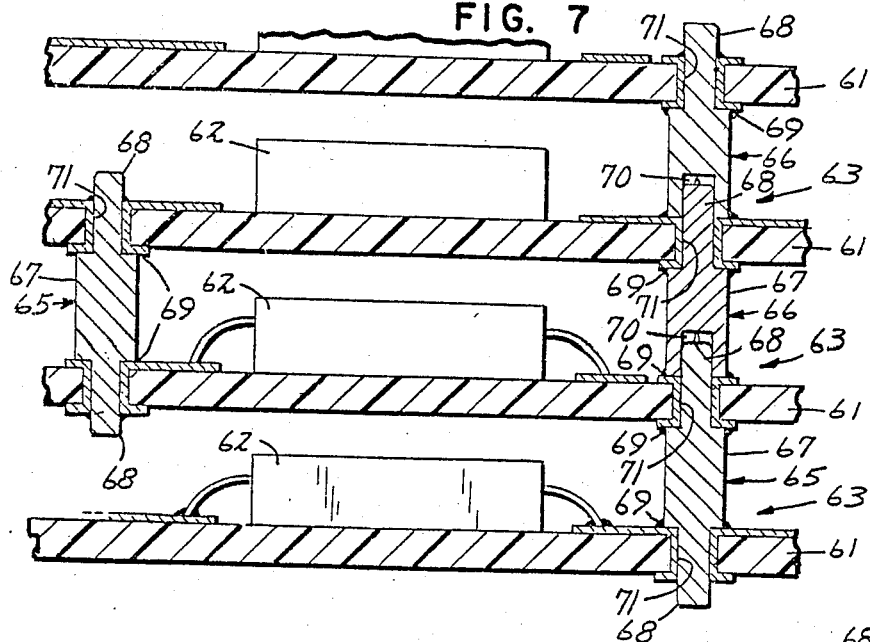
FIG. 7 is an enlarged sectional view showing the details of interconnection and support between circuit boards of a circuit module of FIGS. 4 and 5.
Figure 8:
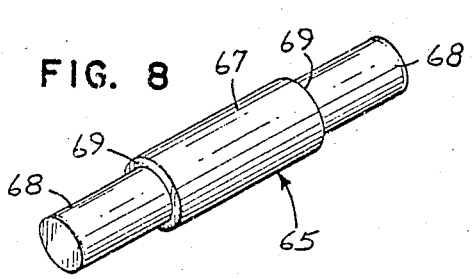
FIGS. 8 and 9 are perspective views of the connectors/spacers of FIG. 7.
Figure 9:
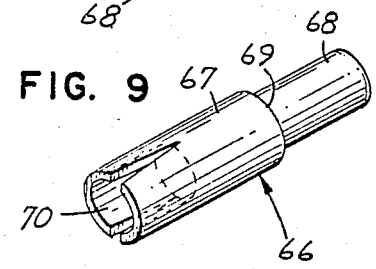

As seen in greater detail in FIGS. 6-9, a plurality of jumper pins 65, 66 are provided. These fit within holes which are provided between opposing pairs of boards, and they serve not only to conduct signals between boards, but also to mechanically space and secure all the boards together in the module. Two types of pins 65 and 66 are used, with pin 65 being used as a "starter" pin. Both pins 65 and 66 have a shank portion 67, tip portions 68 having a diameter less than the shank portion at one end, and a shoulder portion 69 between the shank and the tip. The difference is that starter pin 65 has another tip 68 and shoulder 69 at its opposite end, while jumper pin 66 has a recess or socket 70 designed to receive a tip 68. Slots may be provided in the end having recess 70 to accommodate a secure fit. In practice, jumper pins 65, 66 are quite small—smaller in proportion to the intergrated circuits than is indicated in FIG. 7, wherein they have been somewhat exaggerated in size for purposes of illustration.

Rather than providing uniform patterns of jumper pins on each board, the number used and their locations may be varied as dictated by considerations of where signal path jumps to adjacent boards are required. If a signal jump between only two adjacent boards is required, a single starter pin 65 would be used, as indicated in the center of FIG. 7. If jump connections are needed between three or more boards at the same location, a starter pin 65 is used, and where its tip projects through one of the boards, a jumper pin 66 fits over it and continues to the next board, and so on for as many boards as need to be interconnected at that location. In each case the tip of the jumper projects through the clearance hole 71 provided in the board, and the shoulder portion 69, or the end around recess 70, as the case may be, butts against the board and makes contact with signal traces surrounding the holes. The individual boards are initially drilled at the proper locations for the jumper pins then plated through. As the module is built up board by board, the pins are inserted and soldered until the full stack of boards comprising the module is assembled. Typically, a great number of jumper pins is required and provided at a variety of locations across the extent of the various boards, with the result that the final module is securely held together, and accurately spaced by the collection of jumper pins.

Figure 5:
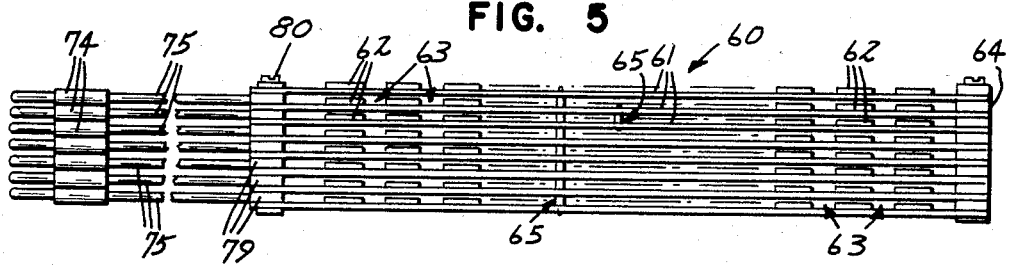
Figure 6:
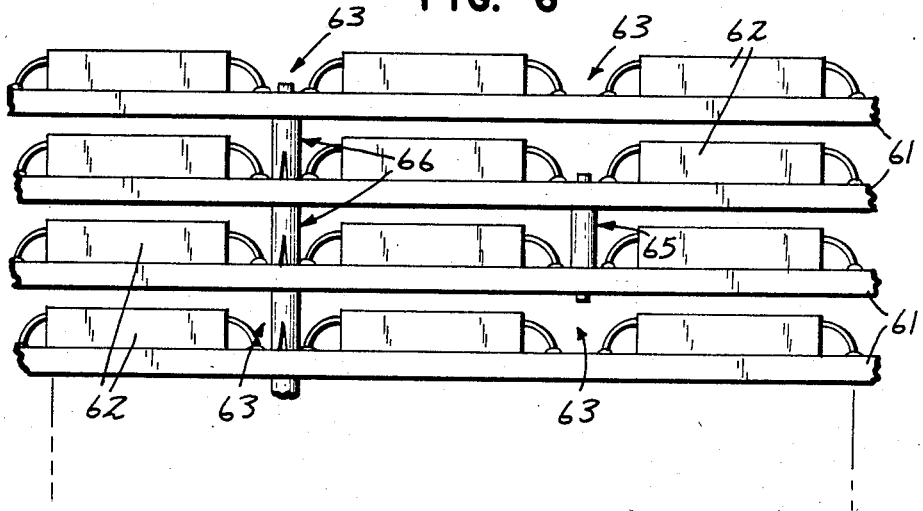
FIG. 6 is a fragmentary elevational view as seen generally from the line 6—6 of FIG. 4, at an enlarged scale.

At the end of the module opposite connector 64, a plurality of connections for power are provided as seen in FIGS. 4 and 5. These take the form of a number of power wires having pin plugs 74 attached to them. As emitter coupled logic is used for high speed operation of the computers, three power connections must be provided: ground, minus two volts and minus 5.2 volts. In the preferred form, the plurality of leads 77 and the plurality of leads 78 are all for ground connections, and the groups of leads 75 and 76 are for the respective negative voltage supplies. As seen in the side view of FIG. 5, the group of leads 75 consists of seven leads which connect to clamping block 79, are held together by bolt 80 passing through the module, to provide mechanical support and electrical contact with traces on the board for one of the power connections. Similar clamping blocks and bolts are provided for the leads to the other power supply and ground.

In the preferred form of the invention, all rows of integrated circuits are completely filled on each board.

Where the circuit design of a particular module is such that less than a full complement of integrated circuit packages is needed on a particular circuit board, the otherwise empty locations are instead filled with "dummy" circuits. This is done to maintain the integrated circuit rows and flow channels 63 uniform across the board, and across all boards within a module to maintain even resistance to fluid flow across the entire module, and to prevent the occurrence of local paths of low fluid flow resistance that would tend to rob the remainder of the circuits of a portion of the flow. The "dummy" circuits can be defective or rejected integrated circuits mounted to the boards to physically occupy the otherwise empty spaces, but of course they are not connected to power for operation.

Figure 10:
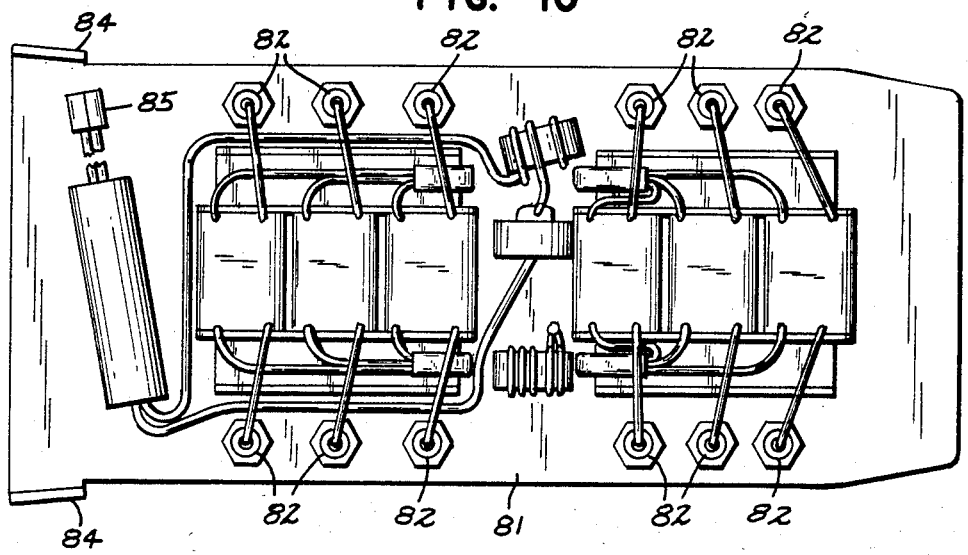
FIGS. 10 and 11 are top plan and side elevational views respectively of a power module used in the computer.
Figure 11:
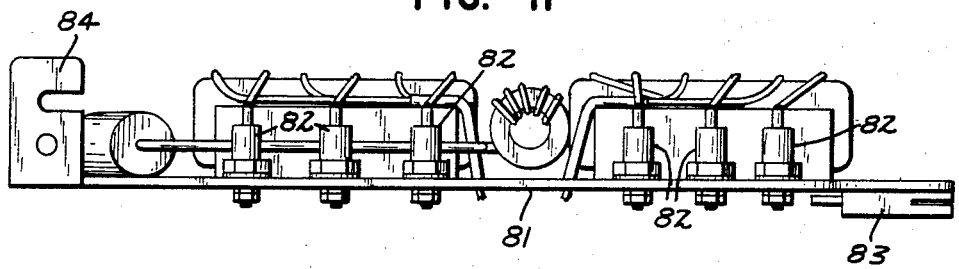

Power modules as shown in FIGS. 10 and 11 are preferably the same width as logic and memory modules of FIGS. 4 and 5 for convenience of mechanical design in stacking them in the same stacks in the computer. In the embodiment shown, the power modules are somewhat longer than the logic and memory modules, and also somewhat thicker. Each power module consists of a metallic plate 81, to which the semiconductor rectifiers 82 are mounted. Plate 81 serves as a ground for the power supply. Transformers and other components are mounted on plate 81 towards the center thereof as indicated in drawings, and a connector 83 is attached at one end of the module, beneath the end of plate 81. This connector is used for providing AC power to the module. At the other end of the power module, a pair of upturned tab portions 84 are used for connection to ground buses in the computer. The minus voltage power supply is applied through another tab 85 which is connected to a power supply bus in the computer assembly.

Figure 14:
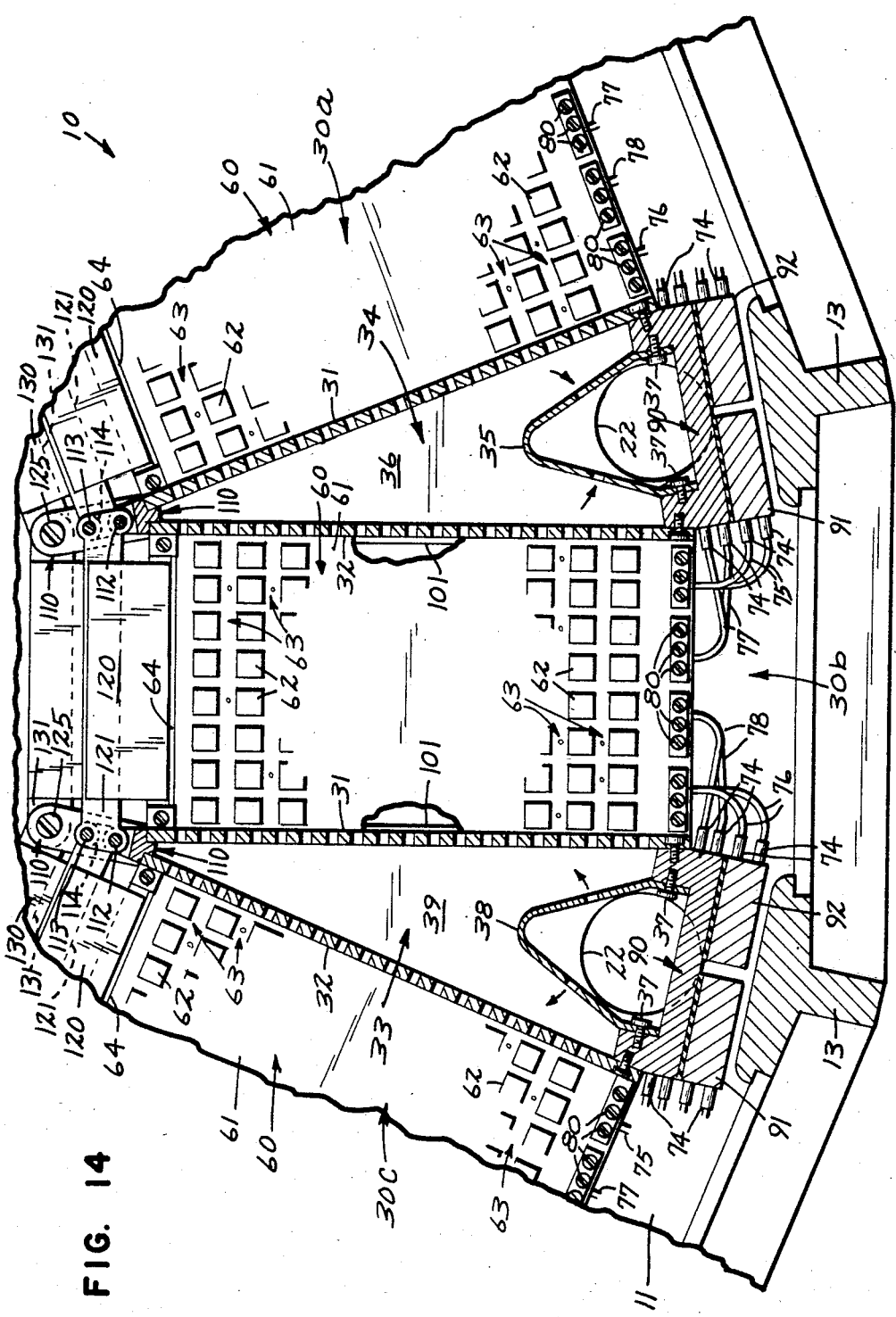
FIG. 14 is a fragmentary horizontal section as seen along line 14—14 of FIG. 1 illustrating the relationship between a circuit module stack and adjacent coolant supply and return columns, at an enlarged scale.
Figure 15:
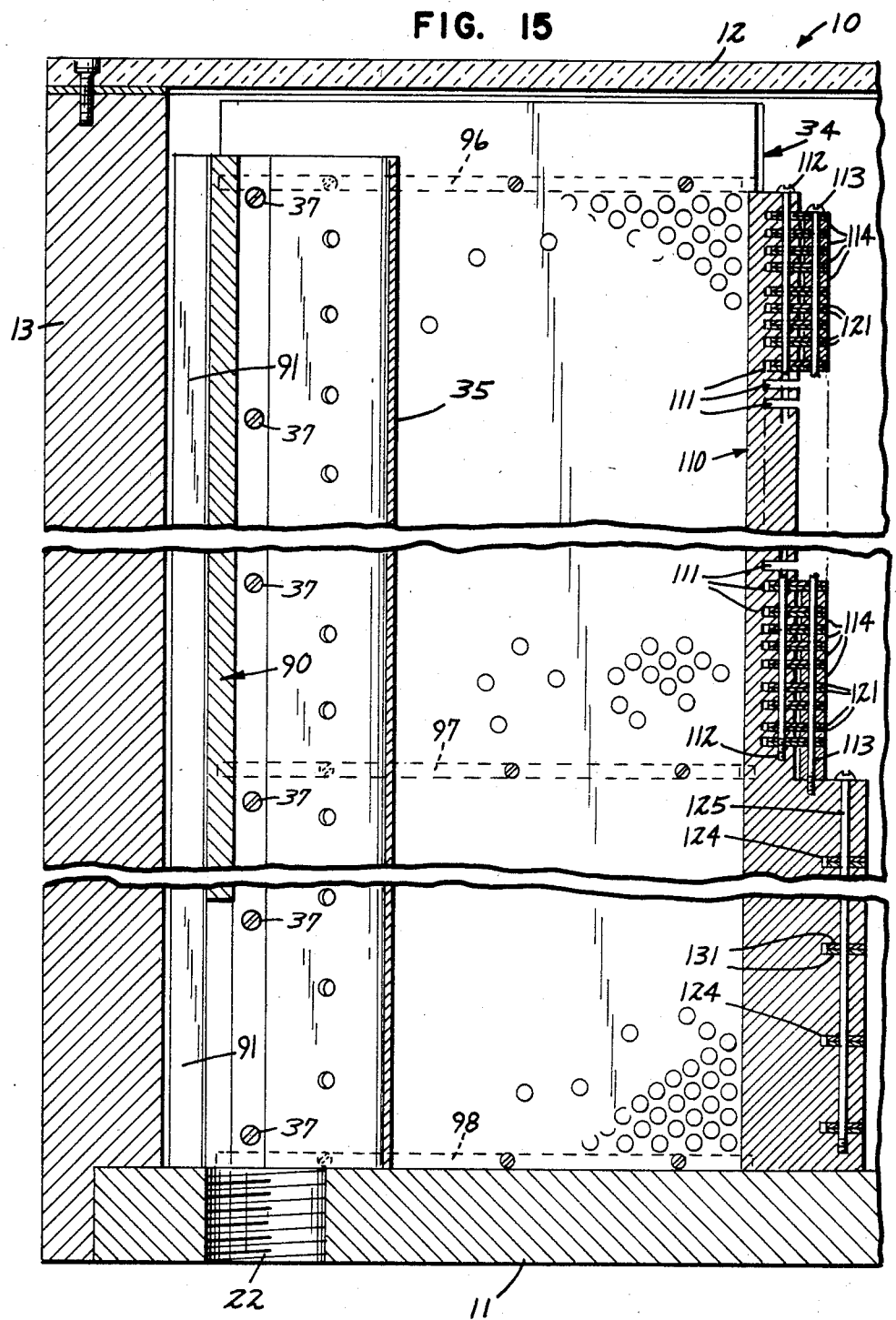
FIG. 15 is a vertical section on an enlarged scale taken along line 15—15 of FIG. 12, through a coolant return standpipe.
Figure 16:
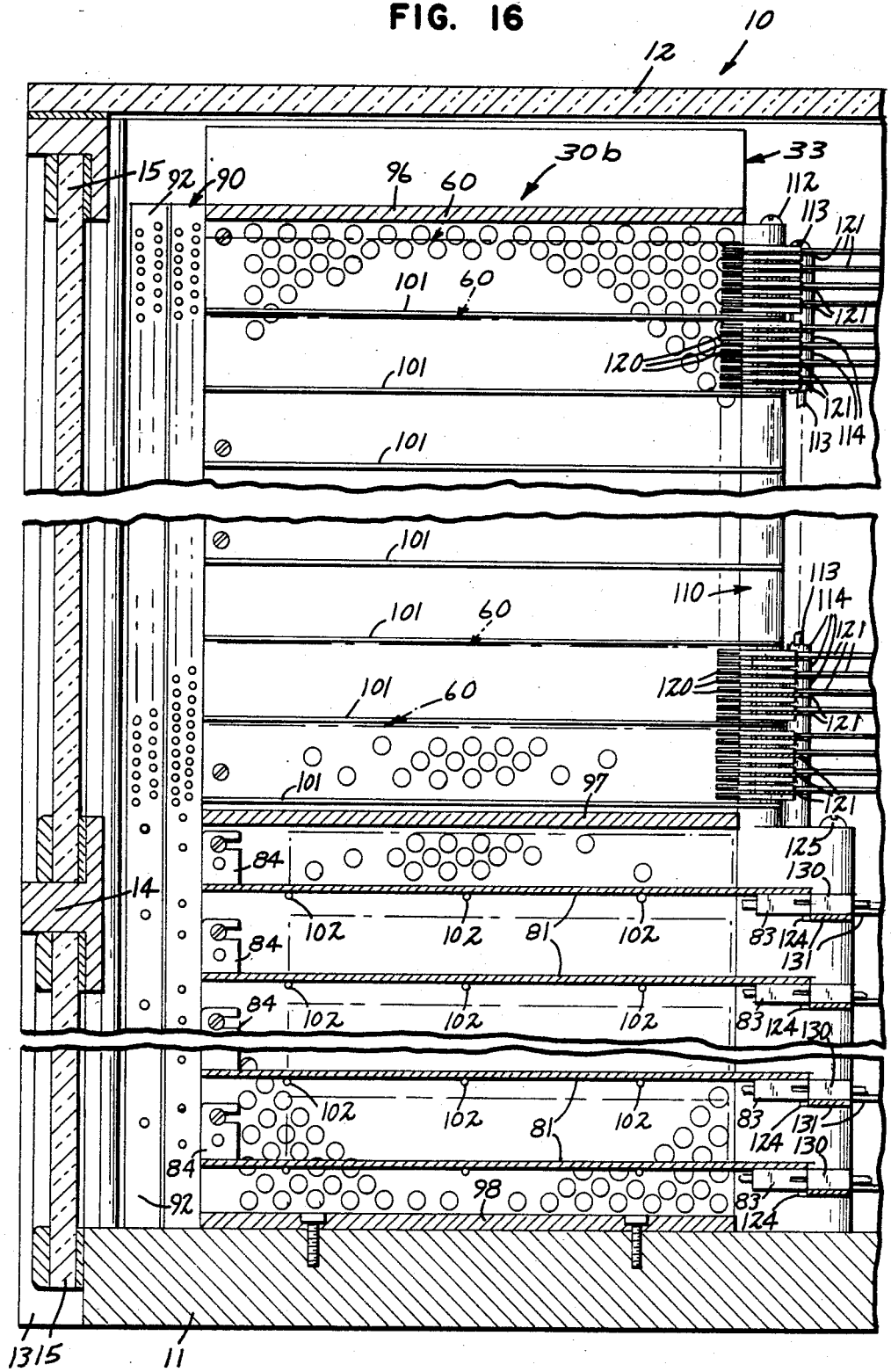
FIG. 16 is a vertical section at an enlarged scale taken along line 16—16 of FIG. 12, showing the perforated module support frame.

Referring now to FIGS. 14, 15 and 16, additional features and details of construction of the assembly are shown. Each module stack consists of a vertical stack of a number of power modules with a number of logic or memory modules atop of them. However, the modules do not physically rest on one another; instead, they are all supported by a framework which includes of a pair of vertical module support frame members 31, 32, which in turn are supported by or connected to other members. As seen in FIG. 14, a vertically oriented U-shaped channel member 90 which also serves as the ground bar is positioned at the wide end of each triangular shaped coolant flow column. Module support frames 31 and 32 bolt thereto for support. Also, the ground tabs 84 of the power supply module are bolted thereto for ground connection, although this connection is not visible in FIG. 14. Further, the ground leads 77 and 78 from the various logic and memory modules plug into holes provided in the sides of ground bars 90 to accept the pin plugs. Attached to the outsides of ground bars 90, but electrically insulated therefrom, are power supply bus bars 91 and 92 which carry the two negative voltage supplies. They also have holes on their sides to receive pin plugs 74 from the respective power leads 75, 76 to provide power to the logic and memory modules. Although not visible in FIG. 14, in the lower sections of each stack, the appropriate power modules have their power tabs 85 secured to the appropriate one of buses 91, 92 to supply voltage thereto. A module stack top plate 96 extends between and is secured to pairs of module supports 31, 32 defining a stack therebetween. Also provided are a module stack intermediate plate 97, and a module stack bottom plate 98 which also connect between and secure the vertical module supports. The bottom plate in turn is secured to the base 11 of the tank.

As previously stated, the vertical module support frames 31 and 32 are perforated to provide relatively unrestricted flow of coolant fluid therethrough so that it can go through and around the module. In addition, grooves are provided therein and these receive nylon glides 101 which support the individual logic and memory modules. In the lower sections, the power modules are supported by a plurality of support pins 102 provided in vertical supports 31, 32.

At the front or narrow portion of each of the sector shaped vertical coolant flow columns, adjoining support frames 31 and 32 abut an apex members 110. These apex members are used also for securing connectors 120 of the module-to-module wiring which mate with the connectors 64 on the circuit boards, and also for securing connectors 130 which mate with connectors 83 on the power modules.

As seen in FIG. 14, each apex member 110 is notched to receive the edges of adjoining support frames 31, 32, and it is secured thereby by a dovetail joint. The other edge of apex member 110 which points toward the central zone of the computer has a plurality of slots 111 as seen in FIG. 15. These slots receive connector mounting strips 121 each of which has a pair of connectors glued thereto. Strips 121 have a pair of holes on each side at an angle corresponding to the angular orientation between adjacent stacks, so that strips from adjacent rows of connectors have their holes superimposed. These are positioned in slots 111 of the apex member, and secured by pins 112 and 113 which pass through holes capturing the connector mounting strips. Spacers 114 are interposed between strips with pin 113 passing through them. In this manner the connectors 120 are held in place to the module support frame by the apex members 110. They mate with the connectors 64 on the circuit boards of the modules when the modules are in place in the stack.

Apex member 110 is stepped further outwardly in the lower portion to accommodate the greater length of the power modules. It also has slots, numbered 124, and these receive the power connector mounting strips 131. These also have holes and overlap with the mounting strips on adjacent stacks, and are together secured by pins 125 and held in place thereby. The strips 131 have connectors 130 secured thereto which mate with connectors 83 to permit AC connection to the power modules when they are in place in the stack.

Standpipes 35 are formed of plastic in a wedge shape smaller than the sector area between adjoining stacks to provide rising zones 36 for the coolant. Inside the standpipe is the downward path of coolant towards the coolant circulation holes 22 in the base member 11. Standpipes 35 are bolted at their back ends to the inside of the channel portions of the ground buses, as indicated at 37. The lower portion of the standpipe 35 covers the coolant circulation holes 22 in the base.

The capped standpipes 38 in the inlet fluid columns are constructed and mounted in the same manner as outlet standpipes 35, except that standpipes 38 are sealed at their top by a cap. Standpipes 38 are also positioned over and cover an inlet hole 22 in the base. Both inlet standpipes 38 and outlet standpipes 35 have a plurality of holes in their sides. The number, spacing, and size of the holes can be selected according to the coolant flow needs of a particular design, but in the presently preferred embodiment, individual holes are provided at spaced locations along standpipes 35 and 38 corresponding to the spacing of the individual modules in the stack.

In the case of inlet columns 33, standpipes 38 serve as distribution manifolds which receive the inflow of fluid from the inlet hole 22 in the base, and restrict flow to provide a static head pressure which then distributes the fresh coolant flow uniformly at all levels through zone 39 of the column, to assure equal amounts of cooled coolant being delivered to all levels in the stack. In the case of the outlet standpipes 35, part of the fluid is removed from zones 36 by the holes in the sides of the standpipe, and part of the fluid is partially driven by convection to the top of zone 36 to overflow standpipe 35.

A number of conduit pipes 26 extend upwardly from base 11, as seen in FIG. 12, to bring wiring connections to and from the computer in the container. Those that contain power wires extend up a distance from the floor and the wires therein extend over to the connectors 130 for the power modules. A suitable sealing material is packed around the tops of the conduits where the wires come out to make them fluid tight. Other conduits bring data I/0 to the computer, and the wires from them extend up and connect to various ones of connectors 120. Although not shown in the figures for purposes of clarity, it will be appreciated that a great number of wires extend from and between connectors 120 from module to module within the stack, and also to modules in other stacks, with the result that the central zone, that is to say the zone within the computer container adjacent the connectors, is to a considerable extent occupied by a mat of wires running in various directions.

If it is necessary to service the computer, after drawing down the fluid as discussed above and removing a panel of the tank, the power connections in the form of pin plugs 74 for the module in question are removed from their respective power buses (the power wires are color-coded as are the power and ground buses for obvious reasons) and the module can then be pulled out the outside of the assembly, which uncouples connectors 64 from connectors 120. A power module can similarly be removed by unbolting its output tabs from the respective power bus and ground bus bars and pulling it out, which disconnects its connector 83 from connector 130. Reinsertion is by the opposite procedure.

In operation, the fluid being circulated through the container 10 flows horizontally through the perforations in the vertical module support frames 31, 32, then through modules, between adjacent circuit boards thereof to totally surround and contact all circuit components thereon. The provision of regular rows and channels in the modules aids in the circulation of coolant through the modules. The edges of the integrated circuit packages, their connector pins, the gaps between them, and the occasional inclusion of other components, all provide sufficient turbulence and mixing to insure adequate heat removal. Additional turbulence could be provided of course, but at the expense of slower fluid flow across the circuit boards and possibly less efficient heat removal. As presently envisioned, a flow rate of approximately one inch per second across the boards is believed to be adequate, with coolant entering at approximately 70 degrees, exiting at approximately 90 degrees, and with no point on any circuit exceeding more than about 130 degrees Fahrenheit.

While the above description and accompanying drawings show a preferred embodiment of the invention, it will be appreciated that various changes can be made to numbers, shapes, sizes and orientation of elements while still falling within the scope of the invention.

The invention thus provides for extremely high density packaging of electronic assemblies and effective removal of the considerable amounts of heat generated thereby, thus permitting an entire high speed, high capacity computer with large immediately available random access memory to be operated at very high clock speeds due to the short maximum interconnect path lengths achieved by the invention.

What is claimed is:

1. A liquid immersion cooled electronic assembly, comprising:
    a liquid coolant container;
    a plurality of stacks of spaced circuit boards;
    means positioning said stacks within said liquid coolant container adjacent one another and spaced apart, the spaces between said stacks forming coolant columns; and
    means for supplying a flow of coolant to some of said columns adjacent said stacks and means for removing coolant from others of said columns, said means for supplying coolant and said means for removing coolant connected respectively to alternate columns, said columns to which coolant is supplied and columns from which coolant is removed being on opposite sides of stacks so that coolant supplied on one side of a stack flows between said spaced circuit boards therein to the other side thereof where it is removed to thereby establish coolant circulation across said circuit boards to cool circuit components thereon.

2. A liquid immersion cooled electronic assembly according to claim 1 wherein said stacks of circuit boards are positioned adjacent one another within said container in an at least partially radial pattern with first ends thereof adjacent and with opposite ends diverging from one another to form coolant columns therebetween.

3. A liquid immersion cooled electronic assembly according to claim 1 wherein said means for removing coolant from said columns includes standpipes positioned within said columns.

4. A liquid immersion cooled electronic assembly according to claim 1 wherein said means for supplying a flow of coolant to some of said columns includes distribution manifolds within said columns having a plurality of fluid outlets distributed along the length thereof.

5. A liquid immersion cooled electronic assembly according to claim 1 wherein said circuit boards are grouped and assembled in a plurality of modules, each comprising a number of interconnected closely spaced circuit boards.

6. A liquid immersion cooled electronic assembly according to claim 5 wherein said modules comprise a number of planar circuit boards held together in closely spaced arrangement by a plurality of jumper pins which extend between adjacent circuit boards and are soldered thereto.

7. A liquid immersion cooled electronic assembly according to claim 6 wherein said circuit boards include pluralities of integrated circuits secured thereto in rows forming regular liquid coolant flow channels between adjacent rows and adjacent circuit boards.

8. A liquid immersion cooled electronic assembly according to claim 1 wherein said stacks and columns are positioned vertically and wherein said circuit boards are positioned horizontally.

9. A liquid immersion cooled electronic assembly, comprising:
a liquid coolant container;
a plurality of stacks of spaced circuit boards;
means positioning said stacks witin said liquid coolant container in a pattern with stacks generally adjacent other stacks but spaced apart therefrom, the spaces between stacks forming coolant flow columns;
means for supplying coolant flow to alternate ones of said columns to form coolant supply columns, said means for supplying coolant including elongate distribution manifolds positioned within said supply columns, said manifolds having a plurality of outlet holes along the length thereof to provide a substantially uniform coolant flow to circuit boards at all positions in said stacks; and
means for removing coolant from others of said coolant columns to form coolant removal columns so that coolant supplied on one side of a stack flows between said spaced circuit boards therein to the other side thereof where it is removed to thereby establish coolant circulation flow across said circuit boards to cool the components thereon.

10. A liquid immersion cooled electronic assembly according to claim 9 wherein said means for removing coolant includes standpipes positioned within said coolant removal columns whereby coolant flowing through the stacks is removed by fluid over said standpipes.

11. A liquid immersion cooled electronic assembly according to claim 10 wherein said standpipes include a plurality of holes distributed along the length thereof to remove coolant from said coolant removal columns.

12. A liquid immersion cooled electronic assembly according to claim 9 including pump means and heat exchanger means externally of said container and connected to said coolant supplying and coolant removing means, for recooling and circulating the coolant.

13. A liquid immersion cooled electronic assembly, comprising:
a liquid coolant container;
a plurality of vertical stacks of closely spaced circuit modules, each of said modules comprising a plurality of horizontally spaced circuit boards;
means positioning said stacks adjacent one another in an at least partial radial pattern within said container with first ends of the stacks adjacent one another and opposite ends diverging from one another, said stacks forming sector-shaped columns therebetween;
connection means attached to said first ends of said modules for providing signal interconnection between modules of the stacks;
means for supplying coolant to alternate ones of said columns; and
means for removing coolant from the others of said columns so that coolant supplied on one side of a stack flows between said spaced circuit boards therein to the other side thereof where it is removed to establish circulation of coolant across said circuit boards to cool circuit components thereon, said means for removing coolant including aplurality of vertical standpipes positioned in the coolant removal columns and means for removing coolant from said container through said standpipes.

14. A liquid immersion cooled electronic assembly according to claim 13 wherein said means for supplying coolant includes capped distribution manifolds positioned within said coolant supply columns, said manifolds having a plurality of holes positioned therein to distribute coolant to all modules of said stacks.

15. A liquid immersion cooled electronic assembly according to claim 13 further including a further standpipe positioned within said container higher than standpipes of said coolant removal columns and means connected thereto for removing coolant vapor from the upper portion of said container.

16. A liquid immersion cooled electronic assembly according to claim 13 further including a plurality of power supply buses and means positioning them within said container adjacent and between said diverging ends of said stacks, and connecting means connecting said power buses to said circuit modules.

17. A liquid immersion cooled electronic assembly according to claim 16 wherein some of said modules in said stacks include power supply circuits, and further including means for supplying AC power into said container to said power supply circuits, and means for connecting said power supply circuits to said power buses.

* * * * *